(12) United States Patent
Wang

(10) Patent No.: US 11,751,428 B2
(45) Date of Patent: Sep. 5, 2023

(54) OLED PANEL AND METHOD OF MANUFACTURING THE SAME

(71) Applicant: Wuhan China Star Optoelectronics Semiconductor Display Technology Co., Ltd., Hubei (CN)

(72) Inventor: Zhenmin Wang, Wuhan (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 642 days.

(21) Appl. No.: 16/963,309

(22) PCT Filed: Jun. 22, 2020

(86) PCT No.: PCT/CN2020/097462
§ 371 (c)(1),
(2) Date: Jul. 20, 2020

(87) PCT Pub. No.: WO2021/227205
PCT Pub. Date: Nov. 18, 2021

(65) Prior Publication Data
US 2023/0094484 A1      Mar. 30, 2023

(30) Foreign Application Priority Data
May 15, 2020   (CN) .......................... 202010413067.3

(51) Int. Cl.
*H10K 50/858*      (2023.01)
*H10K 59/65*       (2023.01)
*H10K 71/00*       (2023.01)

(52) U.S. Cl.
CPC ........... *H10K 50/858* (2023.02); *H10K 59/65* (2023.02); *H10K 71/00* (2023.02)

(58) Field of Classification Search
CPC ................................................... H10K 50/858
See application file for complete search history.

(56) References Cited

U.S. PATENT DOCUMENTS 6,333,258 B1 * 12/2001 Miyata .............. H01L 21/31116
257/E21.252
2003/0116854 A1 * 6/2003 Ito ..................... H01L 21/76855
257/761

(Continued)

FOREIGN PATENT DOCUMENTS

| CN | 106410050 A | 2/2017 |
|----|-------------|--------|
| CN | 109037478 A | 12/2018 |

(Continued)

*Primary Examiner* — Caleb E Henry
(74) *Attorney, Agent, or Firm* — PV IP PC; Wei Te Chung; Zhigang Ma

(57) ABSTRACT

An OLED panel and a method of manufacturing the same are disclosed. The OLED panel is provided to be disposed above a camera, and the OLED panel comprises sequentially from top to bottom: a substrate; a light-emitting layer disposed on the substrate; a cathode disposed on the light-emitting layer; a high n value inorganic salt layer disposed on surfaces of the cathode and the light-emitting layer; and a CPL layer disposed on the high n value inorganic salt layer. An entire thickness of the high n value inorganic salt layer and a part of a thickness of the cathode of the OLED panel corresponding to a position above the camera are removed to form a hollow portion, so that the thickness of the cathode above the camera is reduced, so as to increase the light transmittance, thereby improving the quality of photos.

14 Claims, 7 Drawing Sheets

(56) References Cited

U.S. PATENT DOCUMENTS

| | | | |
|---|---|---|---|
| 2004/0180531 A1* | 9/2004 | Horikoshi | H10N 50/01 257/E27.005 |
| 2009/0093128 A1* | 4/2009 | Seamons | C23C 16/26 257/E21.492 |
| 2017/0110532 A1* | 4/2017 | Kim | H10K 59/124 |
| 2017/0148856 A1* | 5/2017 | Choi | H10K 50/844 |
| 2017/0162637 A1* | 6/2017 | Choi | G09G 3/20 |
| 2018/0151834 A1* | 5/2018 | Kanaya | H10K 59/121 |
| 2018/0159075 A1* | 6/2018 | Kim | H01L 27/1218 |
| 2019/0207132 A1* | 7/2019 | Park | H10K 50/852 |
| 2019/0305053 A1 | 10/2019 | Lin et al. | |
| 2019/0334120 A1* | 10/2019 | Seo | H10K 50/8426 |
| 2020/0020752 A1* | 1/2020 | Shi | H10K 59/12 |
| 2020/0064968 A1* | 2/2020 | Kim | G06F 3/0448 |
| 2020/0075692 A1* | 3/2020 | Park | H10K 59/12 |
| 2020/0105194 A1 | 4/2020 | Kim et al. | |
| 2020/0106046 A1* | 4/2020 | Kim | H10K 50/80 |
| 2020/0106057 A1* | 4/2020 | Yoo | H10K 59/121 |
| 2020/0152842 A1* | 5/2020 | Park | G06F 1/1637 |
| 2020/0168683 A1* | 5/2020 | Son | H10K 77/10 |
| 2020/0176520 A1* | 6/2020 | Kim | H10K 50/844 |
| 2020/0176708 A1* | 6/2020 | Kanaya | H10K 59/124 |
| 2020/0194714 A1* | 6/2020 | Won | H10K 59/123 |
| 2020/0194721 A1* | 6/2020 | Lee | H10K 59/40 |
| 2020/0212140 A1* | 7/2020 | Huh | H10K 59/124 |
| 2021/0020712 A1* | 1/2021 | Zhang | H10K 59/122 |
| 2021/0070717 A1* | 3/2021 | Li | H10K 85/322 |
| 2021/0135164 A1* | 5/2021 | Yu | H10K 50/856 |
| 2021/0143365 A1* | 5/2021 | Jo | H10K 59/124 |

FOREIGN PATENT DOCUMENTS

| | | |
|---|---|---|
| CN | 109616587 A | 4/2019 |
| CN | 110518034 A | 11/2019 |
| CN | 110783486 A | 2/2020 |
| CN | 210073852 U | 2/2020 |

\* cited by examiner

OLED PANEL AND METHOD OF MANUFACTURING THE SAME

RELATED APPLICATION

The present application claims the priority to Chinese Patent Application No. 202010413067.3, entitled "OLED PANEL AND METHOD OF MANUFACTURING THE SAME", which was filed in Chinese Patent Office on May 15, 2020, the whole contents of which are incorporated herein by reference.

FIELD OF INVENTION

The present application relates to the field of display technologies, and more particularly, to an OLED panel and a method of manufacturing the same.

BACKGROUND OF INVENTION

Flat display devices have many advantages, such as a thin body, low power consumption, no radiation, etc., thus have been widely used, and includes organic light-emitting displays (OLEDs).

Due to the characteristics of self-illumination, high brightness, wide viewing angles, high contrast, flexibility, and low energy consumption, OLEDs have aroused extensive attention, and have begun to gradually replace traditional liquid crystal displays, so as to widely used in mobile phone screens, computer monitors, full-color TVs and so on. OLED display technologies do not require a backlight, and adopt extremely thin organic material coatings and glass substrates. When current passes, the organic material emits light.

With the development of the technologies, all major panel manufacturers are trying to use the technologies of the under-screen camera to increase the high screen-to-body ratio. The "under-screen camera" is a front camera buried under the screen of the mobile phone, and thus a specific position reserved for the camera on the screen is omitted, so as to increase the screen-to-body ratio. However, compared to the problems related to punch holes and blind vias, the problem needs to be solved is light transmittance of the under-screen camera.

Thus, it is necessary to provide an OLED panel and a method of manufacturing the same to solve the problem existing in the prior art.

SUMMARY OF INVENTION

Technical Problems

The object of the present disclosure is to provide an OLED panel and a method of manufacturing the same, in which by reducing the thickness of the cathode above the camera, the light transmittance is improved, thereby further ensuring the quality of photos.

Technical Solutions

To achieve the aforementioned object of the present disclosure, the present disclosure provides an OLED panel, provided to be disposed above at least one camera, the OLED panel comprising sequentially from top to bottom: a substrate; a light-emitting layer disposed on the substrate; a cathode disposed on the light-emitting layer; a high n value inorganic salt layer disposed on surfaces of the cathode and the light-emitting layer; and a CPL layer disposed on the high n value inorganic salt layer; wherein an entire thickness of the high n value inorganic salt layer and a part of a thickness of the cathode of the OLED panel corresponding to a position above the camera are removed to form a hollow portion, and a number of the hollow portions corresponds to a number of the cameras.

According to an embodiment of the present disclosure, the OLED panel further comprises a TFE structure formed on surfaces of the CPL layer and the high n value inorganic salt layer.

According to an embodiment of the present disclosure, material of the CPL layer is selected from inorganic material with a high n value.

According to an embodiment of the present disclosure, material of the high n value inorganic salt layer is selected from silica.

The present disclosure further provides an OLED panel, provided to be disposed above a camera, the OLED panel comprising sequentially from top to bottom: a substrate; a light-emitting layer disposed on the substrate; a cathode disposed on the light-emitting layer; a high n value inorganic salt layer disposed on surfaces of the cathode and the light-emitting layer; and a CPL layer disposed on the high n value inorganic salt layer; wherein an entire thickness of the high n value inorganic salt layer and a part of a thickness of the cathode of the OLED panel corresponding to a position above the camera are removed to form a hollow portion.

According to an embodiment of the present disclosure, the OLED panel further comprises a TFE structure formed on surfaces of the CPL layer and the high n value inorganic salt layer.

According to an embodiment of the present disclosure, material of the CPL layer is selected from inorganic material with a high n value.

According to an embodiment of the present disclosure, material of the high n value inorganic salt layer is selected from silica.

The present disclosure further provides a method of manufacturing the OLED panel, the OLED panel being provided to be disposed above a camera, the method comprising steps of: providing a substrate; forming a light-emitting layer and a cathode sequentially from bottom to top on the substrate; forming a high n value inorganic salt layer on surfaces of the light-emitting layer and the cathode; at a position corresponding to the camera, removing a portion of the high n value inorganic salt layer above the cathode to expose a portion of the cathode; removing a portion of the exposed cathode; and forming a CPL layer on the high n value inorganic salt layer.

According to an embodiment of the present disclosure, material of the CPL layer is selected from inorganic material with a high n value.

According to an embodiment of the present disclosure, material of the high n value inorganic salt layer is selected from silica.

According to an embodiment of the present disclosure, in the step of removing the portion of the exposed cathode, the portion of the exposed cathode is removed by dry etching.

According to an embodiment of the present disclosure, in the step of forming the high n value inorganic salt layer on the surfaces of the light-emitting layer and the cathode, the high n value inorganic salt layer is formed by chemical vapor deposition.

According to an embodiment of the present disclosure, after the step of forming the CPL layer on the cathode, the method further comprises a step of forming a TFE structure on surfaces of the CPL layer and the high n value inorganic salt layer.

Beneficial Effect

The OLED panel includes sequentially from top to bottom: a substrate; a light-emitting layer, disposed on the substrate; a cathode, disposed on the light-emitting layer; a high n value inorganic salt layer, disposed on surfaces of the cathode and the light-emitting layer; and a CPL layer disposed on the high n value inorganic salt layer; wherein an entire thickness of the high n value inorganic salt layer and a part of a thickness of the cathode of the OLED panel corresponding to a position above the camera are removed to form a hollow portion. By such a structure of the OLED panel, the thickness of the cathode above the camera is reduced, so as to increase the light transmittance, thereby improving the quality of photos.

DESCRIPTION OF DRAWINGS

In order to make the above contents of the present disclosure more obvious and understandable, the preferred embodiments are described in detail below with reference to the attached drawings.

DETAILED DESCRIPTION OF PREFERRED EMBODIMENTS

The following description of the embodiments with reference to the attached drawings is used to illustrate specific embodiments of the present disclosure that can be implemented. Furthermore, the direction terms described in the present disclosure, such as upper, lower, top, bottom, front, rear, left, right, inner, outer, lateral, peripheral, center, horizontal, transverse, vertical, longitudinal, axial, radial, uppermost or lowermost layer, etc., are only the directions by referring to the attached drawings. Therefore, the directional terms are used to illustrate and understand the present disclosure, not to limit the present disclosure.

Figure 1:
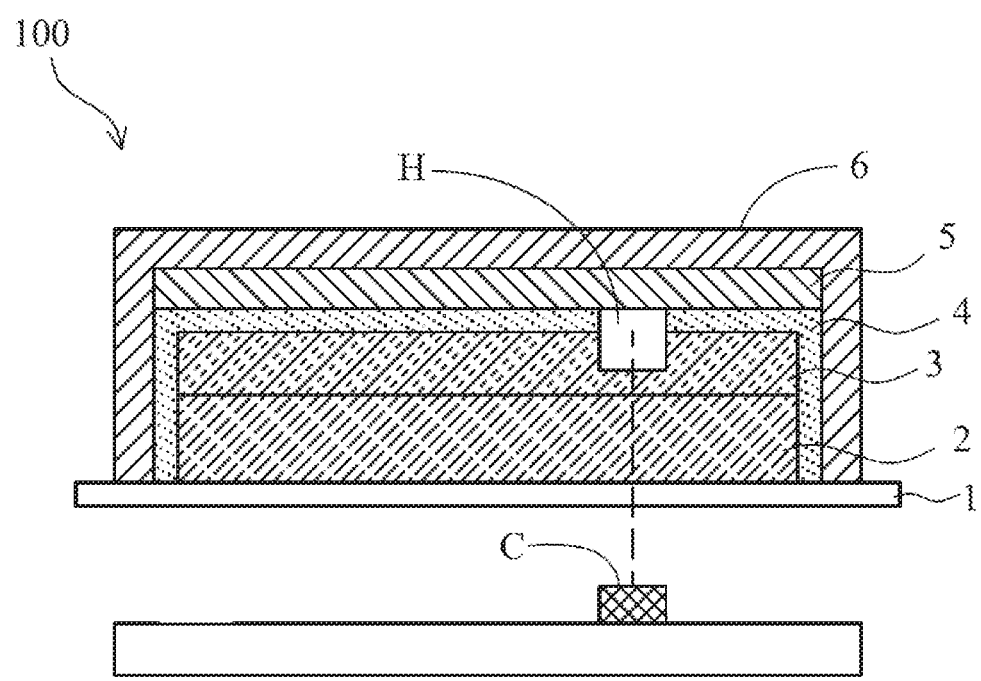
FIG. 1 is a schematic diagram of an OLED panel according to an embodiment of the present disclosure.

Please refer to FIG. 1. An OLED panel 100 according to an embodiment of the present disclosure is provided to be disposed above a camera C. The OLED panel 100 includes sequentially from top to bottom: a substrate 1; a light-emitting layer 2, disposed on the substrate 1; a cathode 3, disposed on the light-emitting layer 2; a high n value inorganic salt layer 4, disposed on surfaces of the cathode 3 and the light-emitting layer 2; a CPL layer 5, i.e., a light extraction layer, disposed on the high n value inorganic salt layer 4; and a TFE structure 6, formed on surfaces of the CPL layer and the high n value inorganic salt layer. A hollow portion H is formed by removing an entire thickness of the high n value inorganic salt layer 4 of the panel 100 and a portion of a thickness of the cathode 3 corresponding to a position above the camera C. Optionally, in the present embodiment, there is one hollow portion H. However, the present disclosure is not limited thereto. In other embodiments, the number of the hollow portion H may be increased or decreased according to the number of cameras, thereby improving the quality of photos, and increasing the shooting range.

Preferably, material of the high n value inorganic salt layer 4 is selected from silica, which has the characteristics of greater hardness and wear resistance, for protecting the light-emitting layer 2 and the cathode 3.

Preferably, material of the CPL layer 5 is selected from a material with a high n value, i.e., a material with a high refractive index (2.0 to 2.5), which can improve light transmittance. Preferably, in the present embodiment, the material of the CPL layer 5 is selected from inorganic material with a high n value.

Figure 2:
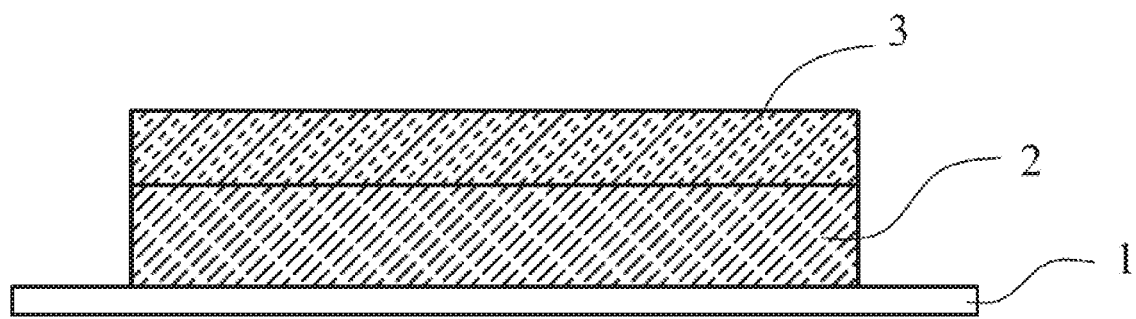
FIG. 2 is a schematic diagram of a first step of a method of manufacturing an OLED panel of the present disclosure.
Figure 3:
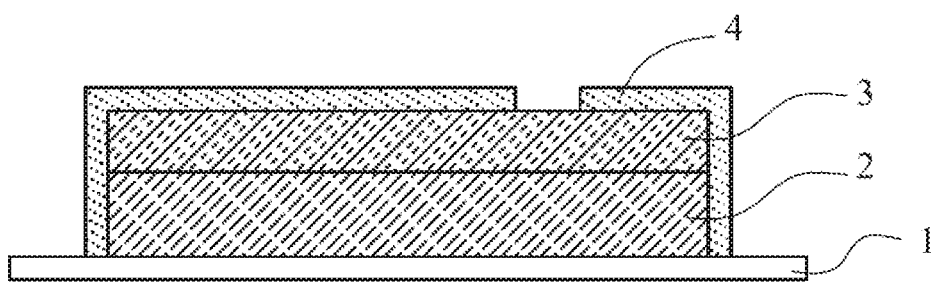
FIG. 3 is a schematic diagram of a second step of a method of manufacturing an OLED panel of the present disclosure.
Figure 4:
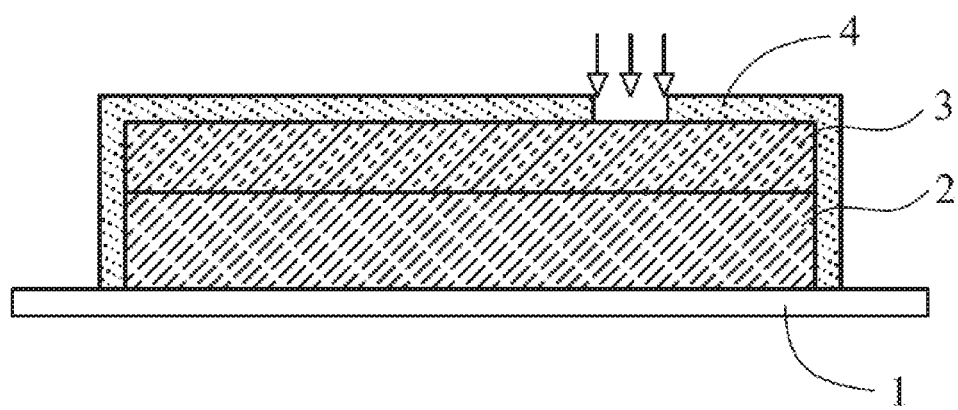
FIG. 4 is a schematic diagram of a third step of a method of manufacturing an OLED panel of the present disclosure.
Figure 5:
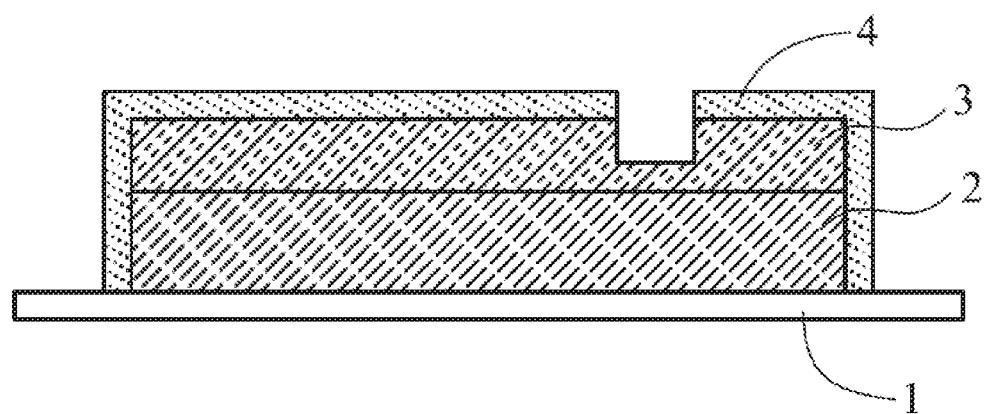
FIG. 5 is a schematic diagram of a fourth step of a method of manufacturing an OLED panel of the present disclosure.
Figure 6:
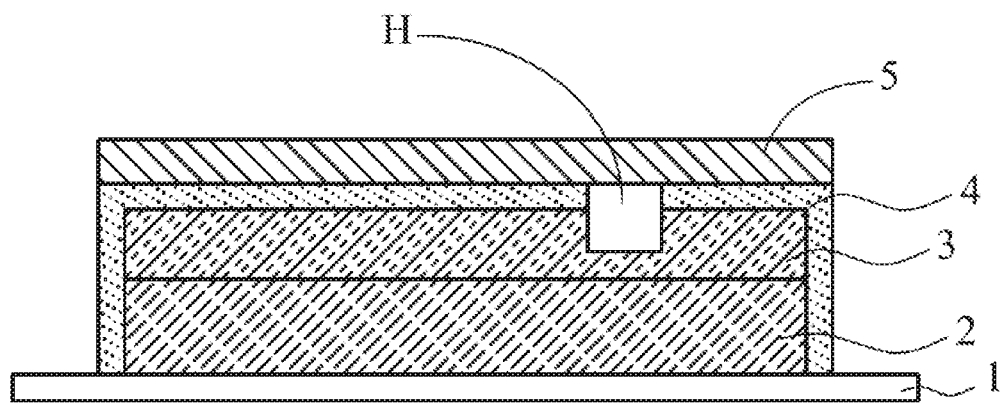
FIG. 6 is a schematic diagram of a fifth step of a method of manufacturing an OLED panel of the present disclosure.
Figure 7:
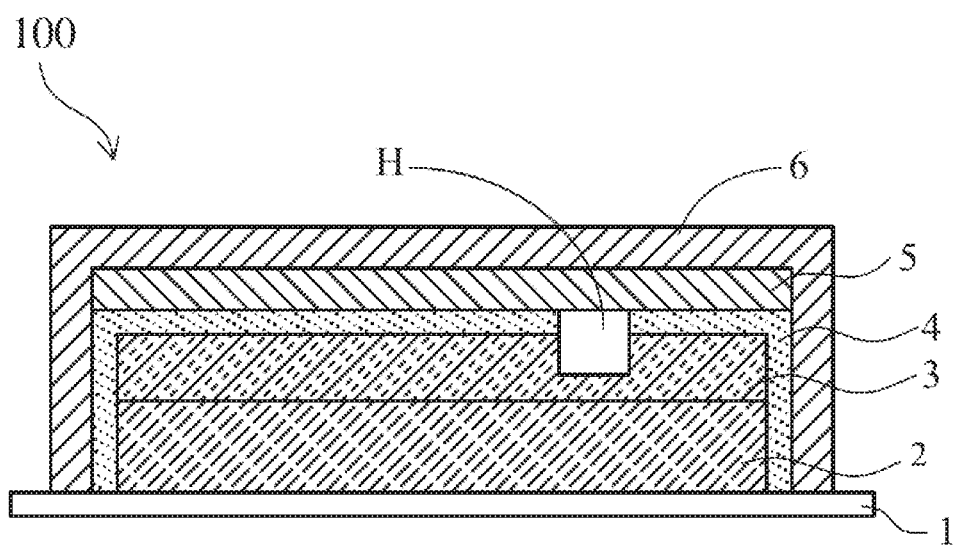
FIG. 7 is a schematic diagram of a sixth step of a method of manufacturing an OLED panel of the present disclosure.

Please refer to FIG. 2 to FIG. 7, which are schematic structural views of each step of the manufacturing method of the OLED panel 100 of the present disclosure. The OLED panel 100 is provided to be disposed above a camera C (see FIG. 1). The manufacturing method of the OLED panel includes the following steps:

providing a substrate 1, and forming a light-emitting layer 2 and a cathode 3 on the substrate 1 sequentially from bottom to top (FIG. 2).

forming a high n value inorganic salt layer 4 on surfaces of the light-emitting layer 2 and the cathode 3, so as to protect the light-emitting layer 2 and the cathode 3 with the high hardness and wear resistance of the high n value inorganic salt layer 4. In the present embodiment, the high n value inorganic salt layer 4 is formed on the upper surfaces and side surfaces of the light-emitting layer 2 and the cathode 3. In addition, at a position corresponding to the camera C (see FIG. 1), a portion of the high n value inorganic salt layer 4 above the cathode 3 is removed to expose a portion of the cathode 3 (FIG. 3). Preferably, material of the high n value inorganic salt layer 4 is selected from silica.

removing a portion of the exposed cathode 3 (FIGS. 4 and 5) by etching to reduce a thickness of the cathode 3. Preferably, in the present embodiment, the portion of the cathode 3 is removed by dry etching.

forming a CPL layer 5 (i.e., light extraction layer) by chemical vapor deposition on the high n value inorganic salt layer 4 (FIG. 6) to improve light transmittance, so that a hollow portion H is formed in the region where the high n value inorganic salt layer 4 and the cathode 3 are removed. Preferably, the material of the CPL layer 5 is selected from a material with a high n value, i.e., a material with a high refractive index (2.0 to 2.5), which can improve the light transmittance efficiency. Preferably, in the present embodiment, the material of the CPL layer 5 is selected from inorganic material with a high n value.

Finally, forming a thin film encapsulation (TFE) structure 6 on surfaces of the CPL layer 5 and the high n value inorganic salt layer 4 (FIG. 7) to protect the whole structure. Generally, the TFE structure is formed by a stack structure of two or more multilayer thin films, including an inorganic thin film layer and a planarization layer, which can be formed by evaporation, screen printing, inkjet printing, etc.

Accordingly, the OLED panel of the present disclosure includes sequentially from top to bottom: a substrate; a light-emitting layer, disposed on the substrate; a cathode, disposed on the light-emitting layer; a high n value inorganic salt layer, disposed on surfaces of the cathode and the light-emitting layer; and a CPL layer disposed on the high n value inorganic salt layer; wherein an entire thickness of the high n value inorganic salt layer and a part of a thickness of the cathode of the OLED panel corresponding to a position above the camera are removed to form a hollow portion. By such structure of the OLED panel of the present disclosure, the thickness of the cathode above the camera is reduced, so as to increase the light transmittance, thereby improving the quality of photos.

In summary, although the present disclosure has been disclosed by the above preferred embodiments, the above preferred embodiments are not intended to limit the present disclosure. Various changes and modification can be made by a person having ordinary skill in the art without departing from the spirit and scope of the present disclosure. Thus, the protection scope of the present disclosure is subject to the scope defined by the claims.

What is claimed is:

1. An OLED panel, provided to be disposed above at least one camera, the OLED panel comprising sequentially from top to bottom:
    a substrate;
    a light-emitting layer disposed on the substrate;
    a cathode disposed on the light-emitting layer;
    a high n value inorganic salt layer disposed on surfaces of the cathode and the light-emitting layer; and
    a CPL layer disposed on the high n value inorganic salt layer;
    wherein an entire thickness of the high n value inorganic salt layer and a part of a thickness of the cathode of the OLED panel corresponding to a position above the camera are removed to form a hollow portion, and a number of the hollow portions corresponds to a number of the cameras.

2. The OLED panel of claim 1, wherein the OLED panel further comprises a TFE structure formed on surfaces of the CPL layer and the high n value inorganic salt layer.

3. The OLED panel of claim 1, wherein material of the CPL layer is selected from inorganic material with a high n value.

4. The OLED panel of claim 1, wherein material of the high n value inorganic salt layer is selected from silica.

5. An OLED panel, provided to be disposed above a camera, the OLED panel comprising sequentially from top to bottom:
    a substrate;
    a light-emitting layer disposed on the substrate;
    a cathode disposed on the light-emitting layer;
    a high n value inorganic salt layer disposed on surfaces of the cathode and the light-emitting layer; and
    a CPL layer disposed on the high n value inorganic salt layer;
    wherein an entire thickness of the high n value inorganic salt layer and a part of a thickness of the cathode of the OLED panel corresponding to a position above the camera are removed to form a hollow portion.

6. The OLED panel of claim 5, the OLED panel further comprises a TFE structure formed on surfaces of the CPL layer and the high n value inorganic salt layer.

7. The OLED panel of claim 5, wherein material of the CPL layer is selected from inorganic material with a high n value.

8. The OLED panel of claim 5, wherein material of the high n value inorganic salt layer is selected from silica.

9. A method of manufacturing the OLED panel as claimed in claim 1, the OLED panel being provided to be disposed above a camera, the method comprising steps of:
    providing a substrate;
    forming a light-emitting layer and a cathode sequentially from bottom to top on the substrate;
    forming a high n value inorganic salt layer on surfaces of the light-emitting layer and the cathode;
    at a position corresponding to the camera, removing a portion of the high n value inorganic salt layer above the cathode to expose a portion of the cathode;
    removing a portion of the exposed cathode; and
    forming a CPL layer on the high n value inorganic salt layer.

10. The method of claim 9, wherein material of the CPL layer is selected from inorganic material with a high n value.

11. The method of claim 9, wherein material of the high n value inorganic salt layer is selected from silica.

12. The method of claim 9, wherein in the step of removing the portion of the exposed cathode, the portion of the exposed cathode is removed by dry etching.

13. The method of claim 9, wherein in the step of forming the high n value inorganic salt layer on the surfaces of the light-emitting layer and the cathode, the high n value inorganic salt layer is formed by chemical vapor deposition.

14. The method of claim 9, wherein after the step of forming the CPL layer on the cathode, the method further comprises a step of forming a TFE structure on surfaces of the CPL layer and the high n value inorganic salt layer.

* * * * *